(12) United States Patent
Motz

(10) Patent No.: US 9,419,611 B2
(45) Date of Patent: *Aug. 16, 2016

(54) LOW-POWER ACTIVATION CIRCUIT WITH MOTION SENSOR

(71) Applicant: Infineon Technologies AG, Neubiberg (DE)

(72) Inventor: Mario Motz, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/809,463

(22) Filed: Jul. 27, 2015

(65) Prior Publication Data

US 2015/0333752 A1  Nov. 19, 2015

Related U.S. Application Data

(63) Continuation of application No. 14/320,718, filed on Jul. 1, 2014, which is a continuation of application No. 13/006,654, filed on Jan. 14, 2011, now Pat. No. 9,094,015.

(51) Int. Cl.
*G01B 7/30* (2006.01)
*G01D 5/14* (2006.01)
(Continued)

(52) U.S. Cl.
CPC ............ *H03K 17/9517* (2013.01); *G01D 5/142* (2013.01); *G01P 3/489* (2013.01); *G01P 13/00* (2013.01); *G01R 33/0029* (2013.01); *H03K 5/2472* (2013.01); *H03K 17/94* (2013.01)

(58) Field of Classification Search
CPC ......... G01D 5/142; G01P 13/00; G01P 3/489; G01R 33/0029; H03K 17/94; H03K 17/9517; H03K 5/2472

USPC ................. 324/207.11–207.26, 173–174
See application file for complete search history.

(56) References Cited

U.S. PATENT DOCUMENTS 4,754,220 A    6/1988  Shimizu et al.
5,583,501 A   12/1996  Henrion et al.
(Continued)

FOREIGN PATENT DOCUMENTS

DE    102004002718 A1    11/2004
DE    102008047109 A1     5/2009
(Continued)

OTHER PUBLICATIONS

"TLE 4941plusC: Differential Hall IC for Wheel Speed Sensing", www.infineon.com/sensors, Oct. 2010, p. 1-2.
(Continued)

*Primary Examiner* — Jay Patidar
(74) *Attorney, Agent, or Firm* — Eschweiler & Associates, LLC

(57) ABSTRACT

One embodiment of the present invention relates to a method and apparatus to perform a low power activation of a system by measuring the slope of a digital signal corresponding to a motion sensor measurement value. In one embodiment, a low power activation circuit is coupled to magnetic motion sensor configured to output a magnetic signal proportional to a measured magnetic field. The low power activation circuit may comprise a digital tracking circuit configured to provide a digital signal that tracks the magnetic field and a difference detector configured to detect a difference between a current digital signal and a prior digital signal stored in a digital storage means. If the detected difference is larger than a digital reference level, an activation signal is output to awaken a system from a sleep mode.

20 Claims, 7 Drawing Sheets

(51) Int. Cl.
   *H03K 17/95*    (2006.01)
   *H03K 5/24*     (2006.01)
   *G01P 3/489*    (2006.01)
   *G01P 13/00*    (2006.01)
   *G01R 33/00*    (2006.01)
   *H03K 17/94*    (2006.01)

(56) References Cited

U.S. PATENT DOCUMENTS

| | | |
|---|---|---|
| 5,619,134 A | 4/1997 | Watanabe et al. |
| 6,351,506 B1 | 2/2002 | Lewicki |
| 6,636,035 B2 | 10/2003 | Kiriyama et al. |
| 6,727,689 B1 | 4/2004 | Furlong et al. |
| 6,812,839 B1 | 11/2004 | Belcher et al. |
| 6,995,748 B2 | 2/2006 | Gordon et al. |
| 7,358,876 B1 | 4/2008 | Oo et al. |
| 8,063,629 B2 | 11/2011 | Hackner et al. |
| 8,154,281 B2 | 4/2012 | Motz |
| 8,203,471 B2 | 6/2012 | Motz et al. |
| 8,666,701 B2 | 3/2014 | Motz |
| 2002/0130696 A1 | 9/2002 | Yoshizawa |
| 2002/0190710 A1 | 12/2002 | Steinich et al. |
| 2004/0203361 A1 | 10/2004 | Belcher et al. |
| 2009/0009240 A1 | 1/2009 | Takemoto et al. |
| 2009/0315549 A1 | 12/2009 | Hackner et al. |
| 2010/0052665 A1 | 3/2010 | Van Den Homberg et al. |
| 2011/0133723 A1 | 6/2011 | Forsyth et al. |
| 2011/0215955 A1 | 9/2011 | Motz et al. |
| 2012/0182658 A1 | 7/2012 | Motz |
| 2012/0262317 A1 | 10/2012 | Motz et al. |

FOREIGN PATENT DOCUMENTS

| | | |
|---|---|---|
| DE | 102008063782 A1 | 7/2010 |
| EP | 2037221 A2 | 3/2009 |

OTHER PUBLICATIONS

"Differential Two-Wire Hall Effect Sensor IC", TLE 4941—TLE 4941C Data Sheet, Apr. 2001, p. 1-10.

"AS5510: Linear Hall Sensor with I2C Output", Revision 1-25, www.austriamicrosystems.com, 2010, p. 1-16.

"AS5510: Linear Hall Sensor with I2C Output", Revision 1-24, www.austriamicrosystems.com, 2010, p. 1-16.

"Low Power Hall Switch", TLE 4913 V2.2, Mar. 9, 2004, p. 1-12.

"An Integrated Magnetic Sensor with Two Continuous-Time Converters and Stress Compensation Capability." 2006 IEEE International Solid-State Circuits Conference. Pages 18-20.

"A CMOS Single-Chip Electronic Compass with Microcontroller." 2007 IEEE International Solid State-Circuit Conference. pp. 382, 383, and 609.

"Smart CMOS Sensors with Integrated Magnetic Concentrators." Mar. 8, 2006. pp. 959-962.

"TLE4998C3C: Programmable Linear Hall Sensor." Sep. 2009. pp. 1-42.

"MLX90316 Rotary Position Sensor IC." May 2009. pp. 1-42.

U.S. Appl. No. 13/006,654, filed Jan. 14, 2011.

Office Action dated Jun. 13, 2013 for U.S. Appl. No. 13/050,286.

Notice of Allowance dated Oct. 17, 2013 for U.S. Appl. No. 13/050,286. 27 Pages.

U.S. Appl. No. 14/185,961, filed Feb. 21, 2014.

Non-Final Office Action dated Sep. 13, 2013 for U.S. Appl. No. 13/006,654.

Notice of Allowance dated Mar. 10, 2014 for U.S. Appl. No. 13/006,654.

Non-Final Office Action dated Dec. 18, 2014 in connection with U.S. Appl. No. 14/185,961.

Non-Final Office Action dated Jul. 25, 2014 in connection with U.S. Appl. No. 13/006,654.

Final Office Action dated Feb. 10, 2015 in connection with U.S. Appl. No. 13/006,654.

Notice of Allowance dated Apr. 1, 2015 in connection with U.S. Appl. No. 13/006,654.

Non-Final Office Action dated Apr. 3, 2015 in connection with U.S. Appl. No. 14/320,718.

Non Final Office Action Dated Nov. 5, 2015 U.S. Appl. No. 14/320,718.

Notice of Allowance dated Jun. 17, 2016 for U.S. Appl. No. 14/320,718.

LOW-POWER ACTIVATION CIRCUIT WITH MOTION SENSOR

REFERENCE TO RELATED APPLICATION

This Patent Application is a Continuation Patent Application of U.S. patent application Ser. No. 14/320,718 filed Jul. 1, 2014 in the name of Mario Motz entitled "Low-Power Magnetic Slope Detecting Circuit", which is a continuation of U.S. patent application Ser. No. 13/006,654 filed on Jan. 14, 2011.

BACKGROUND OF THE INVENTION

In many modern day electronic applications, low power consumption is an important design consideration. To reduce the power consumption of an electronic device/system (e.g., a microprocessor), the device/system may be switched from a low power functionally inactive "sleep" mode to a functionally active continuously operating mode. Activating a device/system from sleep mode to a continuous operating mode may be done with accurate contactless measurements. For example, in automotive applications many systems (e.g., headlights, gear shift, etc.) may be configured to operate based upon sensors configured to detect a state of operation (e.g., off, on, parking lights, high beams). However, in many applications it is difficult to achieve a high measurement accuracy without consuming a large current to achieve the contactless measurement (e.g., across a Hall plate or anisotropic magnetoresistance (AMR) sensor).

DETAILED DESCRIPTION OF THE INVENTION

Figure 1:
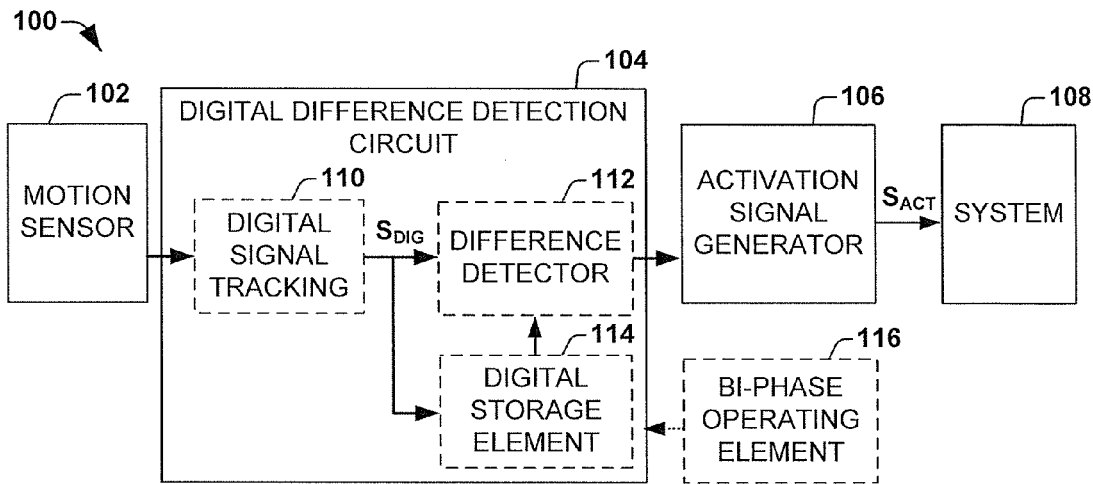
FIG. 1 illustrates a block diagram of a motion sensor system configured to generate an activation signal by detecting the slope of a digital signal corresponding to a motion sensor output.

The present invention will now be described with reference to the attached drawing figures, wherein like reference numerals are used to refer to like elements throughout, and wherein the illustrated structures and devices are not necessarily drawn to scale.

As provided herein, the term "difference" denotes the absolute magnitude of a change (i.e., a positive value). Therefore, the term difference encompasses both a change from a first lower value to a second higher value (a positive change) and a change from a first higher value to a second lower value (a negative change). Accordingly, as provided herein a difference in a digital signal may comprise an absolute value of a positive difference and/or a negative difference, wherein the differences (absolute values) of either be larger than a positive valued digital reference value so long as the magnitude of the difference is larger than the positive digital reference value.

To lower power consumption, a system may be configured to enter a low power functionally inactive sleep mode when it is not in use and a higher power functionally active continuous operation mode when it is in use. To change from one mode to another, an activation circuit may be configured to sense changes in mechanical motion of a sensor system through detecting changes in a magnetic field. Changes in a magnetic field may be detected by comparing a detected magnetic signal to a fixed switching point (e.g., thereby detecting a high or low magnetic field), but such a method does not allow for high-voltage operation or fulfillment of automotive EMC (electro-magnetic robustness, e.g., 100V test pulses). Accordingly, there is a need for a lower power motion sensor that has a high electro-magnetic robustness (e.g., high signal accuracy).

The present invention relates to an activation circuit configured to perform a low power activation of a system by detecting (e.g., measuring) a difference of a digital signal corresponding to a motion sensor measurement value. In one embodiment, a low power activation circuit is coupled to magnetic motion sensor configured to output a magnetic signal proportional to a measured magnetic field. The low power activation circuit may comprise a digital tracking circuit configured to provide a digital signal, corresponding to the magnetic signal, which tracks the magnetic field. The low power activation circuit further comprises a difference detector configured to measure the difference between a current digital signal and a prior digital signal (i.e., a digital signal from an earlier time) stored in a digital storage element. If the measured difference of the digital signal is larger than a digital reference level, an activation signal is generated to awaken a system from a sleep mode to a continuous operating mode. Therefore, by digitally tracking changes of a magnetic signal and comparing a difference with a digital reference level, the low power activation circuit is configured to generate an activation circuit in a manner that provides for electromagnetic robustness and low power consumption with a simple circuitry.

FIG. 1 illustrates a block diagram of a motion sensor system 100 configured to generate an activation signal $S_{ACT}$ by detecting a difference (e.g., a slope) of a digital signal $S_{DIG}$, corresponding to a motion sensor output signal, at different times. As shown in FIG. 1, a motion sensor element 102 is configured to detect physical motion and to provide a motion sensor output sensor signal corresponding to the magnitude of the motion (e.g., corresponding to a magnetic field change indicative of the motion). In various embodiments, the motion sensor element 102 may comprise magnetic sensors (e.g., Hall effect sensors, anisotropic magnetoresistance (AMR) magnetic field sensors, giant magnetoresistance (GMR) magnetic field sensors) or pressure sensors, for example.

In one embodiment, the motion sensor element 102 may be configured to output the motion sensor output signal to a digital difference detection circuit 104 configured to detect a difference between digital signals over time (e.g., to measure a slope of the motion sensor output signal). In one embodiment, the digital difference detection circuit 104 may comprise one or more of a digital signal tracking element 110, a difference detector 112, and a digital storage element 114. In one embodiment, a bi-phase operating element 116 may be coupled to the digital difference detection circuit to allow for the motion sensor system 100 to be operated at a low power by clocking elements of the digital difference detection circuit 104 to alternatively operate in a low power mode (e.g., for a relatively extended time) and a high power mode (e.g., for a relatively short time), thereby resulting in an average low power operation.

In particular, the digital signal tracking element 110 is configured to track the value of the signal output from the motion sensor element 102 as a digital signal (e.g., to generate a digital signal corresponding to a sensed motion). To detect a difference in the digital signal, one or more prior digital signals (i.e., a digital signal from an earlier time) are stored in the digital storage element 114, so that they may be compared to current digital signal values output from the digital signal tracking element 110. In one embodiment, the difference detector 112 is configured to detect a difference in the digital signal by measuring a magnitude change between a first digital signal value at a first time (e.g., received from the digital storage element 114) with a second digital signal value at a later second time (received from the digital signal tracking element 110) to detect a difference in the digital signal. In an alternative embodiment, the difference detector 112 is configured detect a difference in the digital signal by detecting a continual change (e.g., a continual increase in the signal or a continual decrease in the signal) in the digital signal over a time period to detect a difference in the digital signal.

The activation signal generator 106 is configured to receive a difference signal from the difference detection circuit 104 and based upon the received difference signal to selectively output an activation signal $S_{ACT}$ that awakens the system 108 (e.g., from a sleep mode to a continuous mode of operation). In one embodiment, the activation signal generator 106 may comprise a latch configured to provide a signal that can activate an n-channel transistor that provides current into a system. In an alternative embodiment, the activation signal generator 106 may comprise a push-pull output configured to drive or sink a current into the system.

Figure 2:
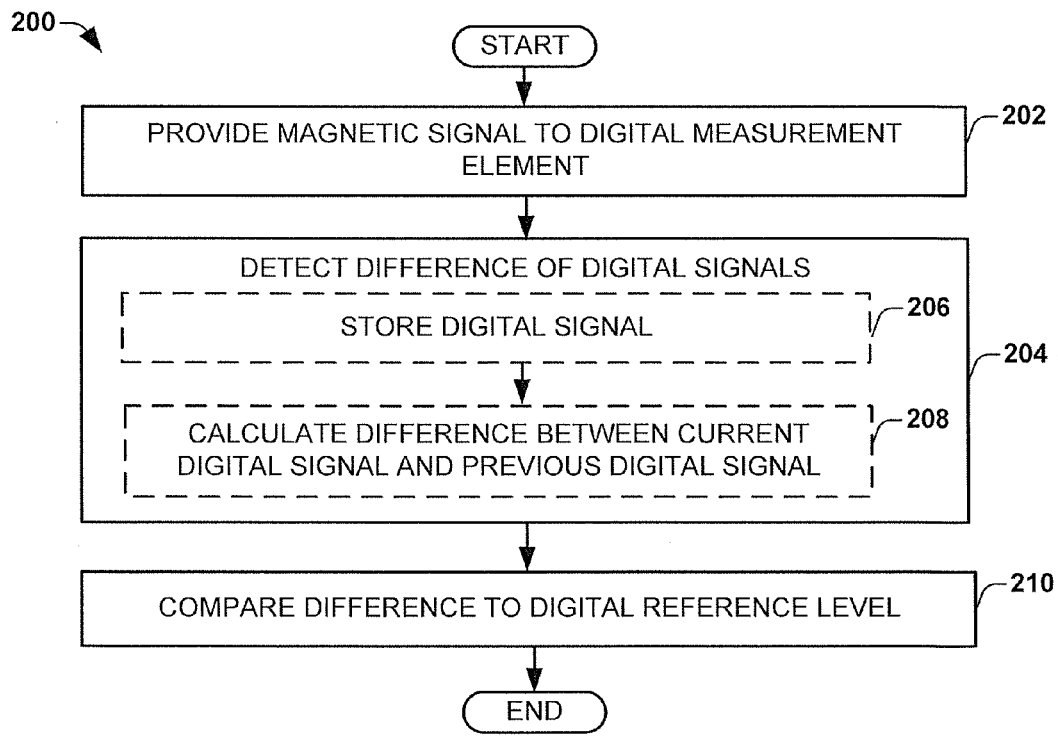
FIG. 2 is a flow diagram showing operation of a motion sensor system as provided herein.

The operation of the motion sensor system 100 is described in the flow diagram shown in FIG. 2. As stated above, the motion sensor system 100 may be clocked to operate in a low current standby mode and a high current operating mode, wherein in the high current operating mode the digital signal is tracked and a difference is calculated.

At 202 an analog motion sensor output signal is provided to a digital measurement element configured to convert the analog signal to a digital signal. In various embodiments, the analog motion sensor signal may comprise a Hall sensor signal, an AMR sensor signal, etc.

A difference in the digital signal is detected at 206. In one embodiment, the difference may be detected by observing a continual change in the same direction (e.g., a continual upward change or a continual downward change in the signal) in the digital signal over a time period, wherein the continual change means that the signal will either increase without decreasing or decrease without increasing for the time period. In another embodiment, the difference can be detected as a difference in the value of the digital signal between a first and a second time.

For example, since the slope of the digital signal is equal to a change in the digital signal value divided by a change in time, the slope of the digital signal denotes a difference in the digital signal between two points in time (e.g., separated by 100 ms). The slope of the digital signal may be measured by storing a previous digital motion sensor signal in the digital storage element 114 (act 206) and then by calculating a difference (act 208) between the current digital motion sensor signal value, provided directly from the digital signal tracking element 110, and the previous digital motion sensor signal value, provided by the digital storage element 114. In one embodiment, the digital motion sensor signal is stored in the storage element 204 through the standby phase of operation.

Figure 3A:
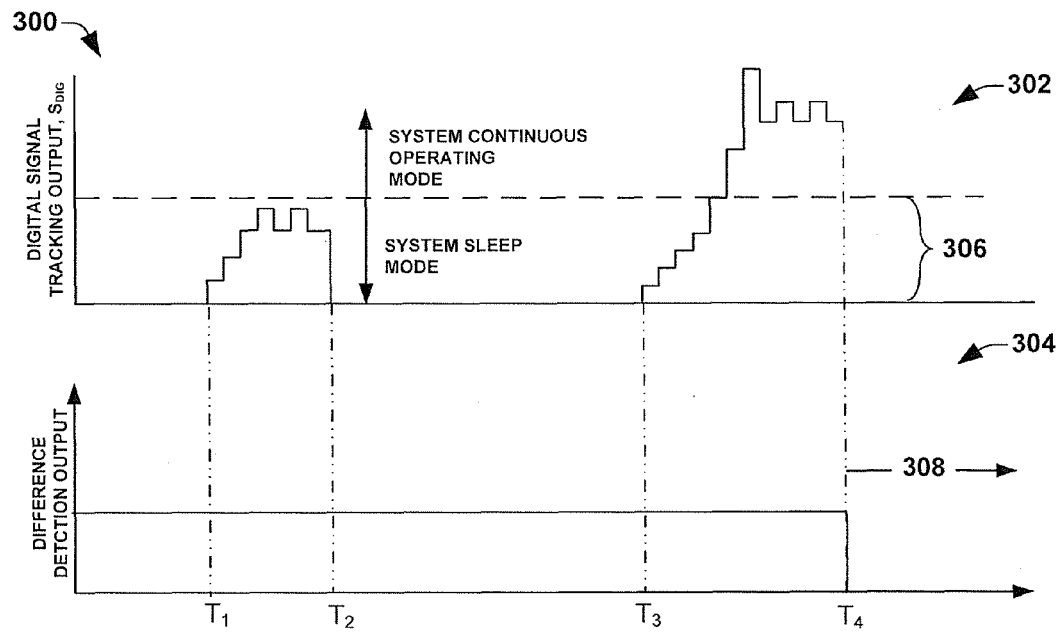
FIG. 3A illustrates an exemplary timing diagram of a motion sensor system configured to generate an activation signal by detecting a difference in the value/magnitude of a digital signal.
Figure 3B:
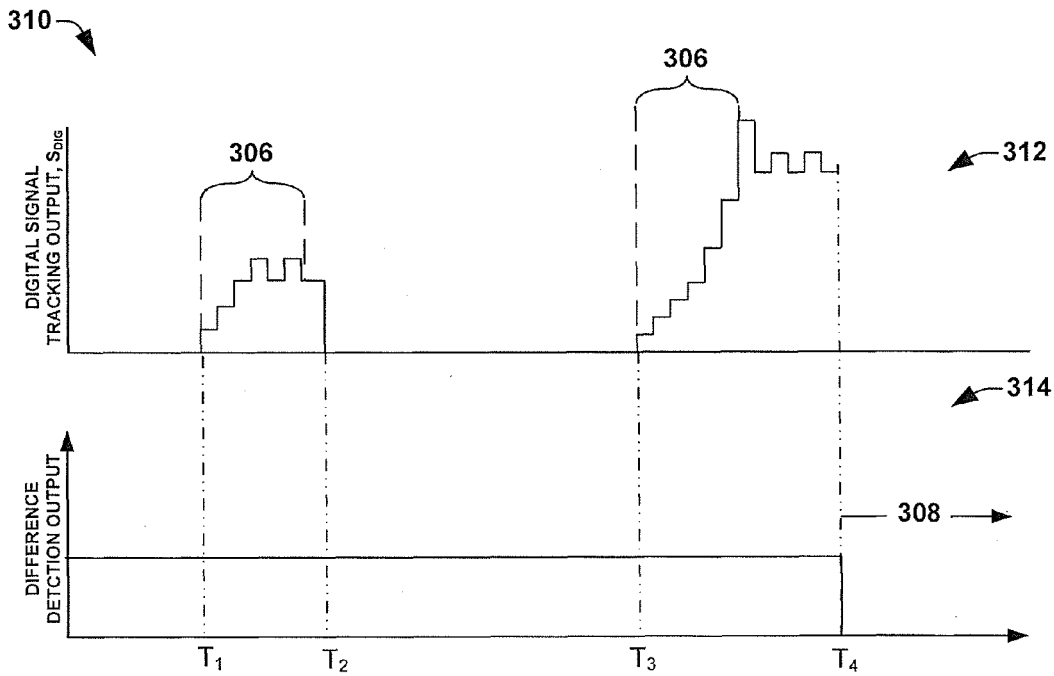
FIG. 3B illustrates an exemplary timing diagram of a motion sensor system (e.g., corresponding to motion sensor system 100) configured to generate an activation signal by detecting a continual change over a period of time.

At 210 the detected difference is compared to a digital reference level. In various embodiments the digital reference level may comprise a signal value (e.g., as shown in FIG. 3a) or a time period (e.g., as shown in FIG. 3b). If the difference is larger than the digital reference level (e.g., indicating that the motion sensor has detected a motion) the activation signal generator may output an activation signal to awaken the system.

FIG. 3a illustrates an exemplary timing diagram of a motion sensor system (e.g., corresponding to motion sensor system 100) configured to generate an activation signal by detecting a difference in the value/magnitude of a digital signal. In particular, graph 302 illustrates an output of a digital signal tracking element (e.g., corresponding to element 110) while graph 304 illustrates an output of a difference detector (e.g., corresponding to element 112).

In particular, the output of the digital signal tracking element shown in graph 302 is a digital signal which corresponds to the change in the motion sensor output signal (e.g., indicating a change in magnetic field detected by a AMR or Hall sensor). By comparing the digital signal $S_{DIG}$ at a first time to the digital signal $S_{DIG}$ at a later time, a difference can be determined. If the difference is greater than a digital reference level 306, the output of the difference detector shown in graph 304 will be driven low, causing activation of the system from a sleep mode to a continuous operating mode (illustrated as line 308).

For example, as shown in FIG. 3a the difference in the digital signal $S_{DIG}$ between a first time $T_1$ and a later time between $T_1$ and $T_2$ is not larger than the digital reference level 306 and therefore the output of the difference detector remains high, so that the activation signal generator does not awaken a system. However, the difference in the digital signal $S_{DIG}$ between a third time $T_3$ and a later time between $T_3$ and $T_4$ is larger than the digital reference level 306 and therefore the output of the difference detector is driven low, so that the activation signal generator outputs an activation signal that awakens the system at time $T_4$.

FIG. 3b illustrates an exemplary timing diagram of a motion sensor system (e.g., corresponding to motion sensor system 100) configured to generate an activation signal by detecting a continual change over a period of time. As shown in FIG. 3, if the digital signal is detected to continually change (e.g., continually increase) during a time period that is greater than a digital reference level 306, the output of the difference detector shown in graph 314 will be driven low, causing activation of the system from a sleep mode to a continuous operating mode (illustrated as line 308).

For example, as shown in FIG. 3b the digital signal $S_{DIG}$ between a first time $T_1$ and a later second time $T_2$ increases for a time period that is not larger than the digital reference level 306 and therefore the output of the difference detector remains high, so that the activation signal generator does not awaken a system. However, the digital signal $S_{DIG}$ between a third time $T_3$ and a later fourth time between $T_4$ increases for a time that is larger than the digital reference level 306 and therefore the output of the difference detector is driven low, so that the activation signal generator outputs an activation signal that awakens the system at time $T_4$.

Figure 4:
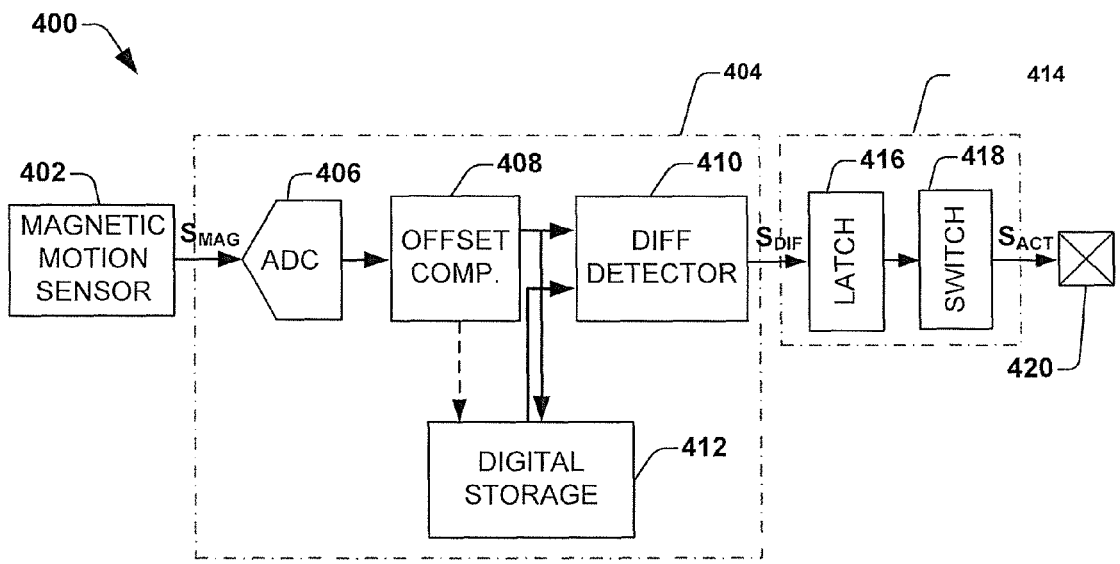
FIG. 4 illustrates a block diagram of a more detailed embodiment of an analog to digital converter that may be used in the motion sensor system provided herein.

FIG. 4 illustrates a block diagram of a more detailed embodiment of a magnetic motion sensor system 400 configured to generate an activation signal $S_{ACT}$ by detecting a difference (e.g., slope) of a digital signal corresponding to an output of the magnetic motion sensor 402, over time.

As shown in FIG. 4, a magnetic motion sensor 402 is coupled to a digital difference detection circuit 404. In one embodiment, the magnetic motion sensor 402 may comprise a Hall plate configured to detect physical motion by detecting changes in an applied magnetic field through use of the Hall effect, and to output an analog magnetic signal $S_{MAG}$ proportional to the detected physical motion. In such an embodiment, the magnetic motion sensor 402 (e.g., Hall plate) may detect the motion of a magnetic structure (e.g., permanent magnet) by providing a current across one axes of the Hall plate and detecting an induced voltage, output as a Hall signal that is proportional to an applied magnetic field, across an orthogonal axes.

In an alternative embodiment, the magnetic motion sensor 402 may comprise an anisotropic magnetoresistance (AMR) sensor configured to detect physical motion by detecting changes in an applied magnetic field. One of ordinary skill in the art will appreciated that AMR sensors can be arranged in a bridge and with "Barber poles" (e.g., 45° metal lines on top of the AMR sensor stripes) that detect the motion of a magnetic structure (e.g., permanent magnet).

The analog magnetic signal $S_{MAG}$ is provided to a digital difference detection circuit 404 comprising an analog-to-digital converter (ADC) 406, an offset compensation element 408, a difference detector 410, and a digital storage component 412. The ADC 406 is configured to receive the analog magnetic signal $S_{MAG}$ and to generate a digital signal corresponding to the analog magnetic signal. In one embodiment, the ADC 406 may comprise a tracking ADC configured to track the value of the analog magnetic signal $S_{MAG}$ as it changes over time.

The digital signal is output to the offset compensation element 408, which is configured to remove offsets from the digital signal. In one embodiment, the offsets may comprise offsets introduced by a Hall plate. In particular, Hall plates typically may experience a zero point offset, wherein a non-zero output signal is generated in the absence of a magnetic field. In such an embodiment, the offset compensation element 408 may be configured to reduce the zero point offset by operating a current spinning method, wherein for a Hall plate having symmetric contacts with respect to a rotation (e.g., by 45°, by 60°, etc.), the direction of the current is made to spin discretely by contact commutation. By averaging the consecutive Hall voltages the offset may be reduced. In alternative embodiments, the offsets may further comprise offsets introduce by the ADC (e.g., a comparator of the ADC), for example.

In another embodiment, the offsets may comprise offsets introduced by an AMR magnetic sensor. In such an embodiment, the offset compensation element 408 may be configured to reduce the offset by operating a "flipping technique" as an offset compensation technique to remove offset generated by the AMR sensor. The flipping technique may inject a high current to a coil adjacent to (e.g., on top of) the AMR sensor for short time periods. The magnetic field output from the coil flips the output signal of the AMR sensor to generate a chopping effect from the AMR sensor. For example, an on-chip coil may create a 100 mA current pulse for 1 µs into the AMR sensor along each axes of the sensor. Thus, by changing (i.e., flipping) the output signal polarity of the AMR sensor the offset can be compensated.

The offset compensated digital signal is output from the offset compensation element 408 provided to a difference detector 410 and to a digital storage element 412. The digital storage element 412 is configured to store offset compensated digital signal values over time. The difference detector 410 is configured to determine a difference between a current offset compensated digital signal value and a previous offset compensated digital signal value. As shown in FIG. 4, one or more previous offset compensated digital signals may be stored in the digital storage element 412 and then provided to the difference detector 410, which also receives the current offset compensated digital signal from the offset compensation element 408, to determine a difference in the digital signal over time.

In one embodiment, the detected difference may be compared to a digital reference level and a difference signal $S_{DIF}$, comprising the difference of different offset compensated digital signals, may be generated based upon the comparison. If a detected difference is larger than the digital reference level, the difference detector 410 may be configured to output a difference signal $S_{DIF}$ to an activation signal generator 414 that indicates that a system 420 is to be activated (e.g., awakened to a continuous operating mode). If the detected difference is smaller than the digital reference level, the difference detector 410 may be configured to output a difference signal $S_{DIFF}$ to the activation signal generator 414 that indicates that the system 420 is to remain in a sleep mode.

In one embodiment the activation signal generator 414 may comprise a latch 416 and a switch 418. In one such embodiment, the latch 416 may be configured to store a digital output signal $S_{DIG}$ (e.g., a gate voltage) that is provided to the switch 418 (e.g. output transistor), to tell the switch 418 if it is to turn on or off (e.g., activate the system or not active the system). For example, the latch 416 may be configured to receive a difference signal $S_{DIFF}$ from the difference detector 410, wherein the difference signal $S_{DIFF}$ is low as long as the detected difference is smaller than the digital reference level and high if the detected difference becomes larger than the digital reference level. Since the latch 416 will remain at a low output so long as the difference signal $S_{DIFF}$ is high, the output of the latch will stay the same. However, when the difference signal $S_{DIFF}$ is changed from a high value to a low value, it will cause the output of the latch to change states, turning on the switch 418 and changing the operating mode of the system 420 (e.g., awakening the system from a sleep mode to a continuous operating mode). In one embodiment, the switch 418 may comprise a transistor device (e.g., n-channel transistor device), such that the output of the latch 416 comprises a gate voltage that controls operation of the transistor.

In one embodiment, the offset value determined by the offset compensation element 408 may be digitally stored (e.g., in the digital storage element 412) for successive application to the output of the ADC. For example, if an offset value is determined by the offset compensation element 408 it may be used in a next operating phase to cancel the offset of the magnetic sensor. The reuse of a calculated offset value can provide offset compensation without having to perform offset compensation techniques, thereby reducing or removing the offset to provide for faster acquisition of the signal and resulting in a saving of time and energy in the activation process (e.g., in acquiring an offset signal).

Figure 5A:
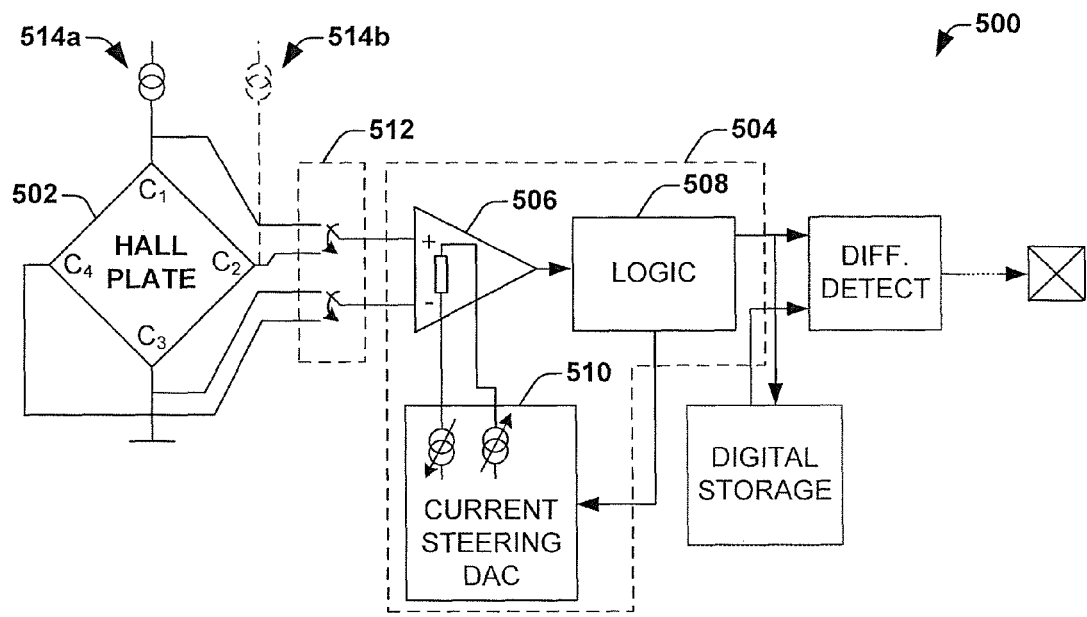
FIG. 5A illustrates a block diagram of a motion sensor system showing a more detailed embodiment of an analog-to-digital converter.

FIG. 5a illustrates a block diagram of an activation circuit 500 for a motion detector, in particular having a more detailed embodiment of an analog-to-digital converter (ADC). As shown in FIG. 5a, the ADC 504 comprises a comparator 506, a digital logic element 508, and a current steering digital-to-analog converter (DAC) 510.

In one embodiment, the comparator 506 may comprise a sense resistor configured to receive a differential input voltage. The current steering DAC 510, having one or more current sources, may be configured to generate a input voltage differential across the sense resistor of the comparator 506 so that a buffered differential input voltage provided by the Hall plate can be compensated by a current provided by the current steering DAC (e.g., since I*R=V). Therefore, the input voltage is copied to the sense resistor of the comparator and at the same time the current steering DAC overlays the input signal with the opposite signal so that the signal at the end of the tracking algorithm is compensated.

In one embodiment, wherein the ADC is configured to perform a step-by-step tracking (e.g., ADC computes one least significant difference per step), the digital logic element 508 may comprise an up/down counter in one embodiment. In such an embodiment, the up/down counter may be configured to receive a digital comparator signal from comparator, which drives operation of the up/down counter. Based upon the comparator signal, the up/down counter will increment or decrement its state, so as to generate a digital ADC output signal that causes the output of the ADC to track the output of the Hall plate (e.g., in a "count up" mode that increments the digital ADC output signal or in a "count down" mode that decrements the digital ADC output signal). Therefore, the up/down counter counts in a proper direction to track the magnetic signal output from the Hall plate.

In one embodiment, one or more switches 512 disposed upstream of the ADC 504 may be configured to selectively couple axes of the Hall plate 502 to the ADC 504 to implement a current spinning method. For example, the Hall plate 502 shown in FIG. 5a is configured to operate according to a 90° rotation between clock phases. Furthermore, ADC 504 (e.g., comprising digital logic configured to perform offset compensation) may generate a difference between a first chopping signal comprising the first Hall voltage (e.g., having a positive value) and a second chopping signal comprising the second Hall voltage (e.g., having a negative value). Demodulation is then performed by subtracting the first chopping signal from the second chopping signal, thereby cancelling out the offset of the Hall voltage.

In other words, the one or more switches 512 may act as a first chopper amplifier of a chopper demodulation circuit by switching the outputs of the Hall plate 502 at a chopping frequency that effectively alternatively adds an offset value (e.g., 10 mV) and subtracts the offset value (e.g., −10 mV) from the induced Hall signal. Such chopping generates a modulated chopping signal at a chopping frequency, due to the swapping. The ADC 504 may act as a filter, configured to remove the AC offset components and to demodulate the modulated chopping signal, back to the baseband.

Since the switches are configured to perform both chopping offset difference building in the time domains, the offset of the motion sensor (e.g., AMR sensor, Hall plate) is cancelled out. This eliminates the effect of unstable offsets (e.g., caused by temperature variations or leakages in analog solutions) since the unstable offsets are cancelled out.

Figure 5B:
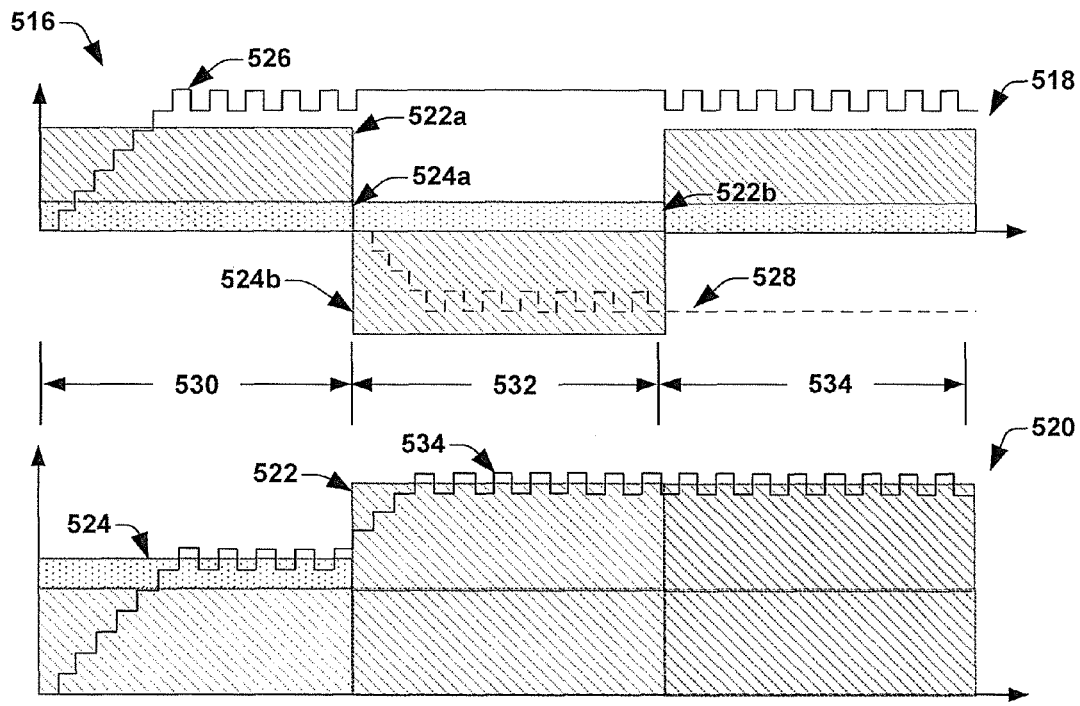
FIG. 5B illustrates a signal diagram showing how the operation of both chopping offset and difference building cancel the offset of the Hall plate.

FIG. 5b illustrates a signal diagram 516 showing one example of how the performance of both chopping offset and difference building can cancel the offset of the Hall plate. In particular, graph 518 illustrates the signal output from the Hall plate 522 and an offset 524, while graph 520 illustrates the digital difference generated by the ADC 504 (e.g., by a digital logic element 508 within the ADC comprising an offset compensation circuit as shown in FIG. 4). Although FIG. 5b is described in relation to a Hall plate spinning method it will be appreciated that the general idea of chopping offset and difference building may be similarly applied to an AMR sensor.

During a first clock phase 530, contacts $C_1$ and $C_3$ are coupled to a first current source 514a, while the one or more switches 512 may be configured to couple contacts $C_2$ and $C_4$ to the ADC 504 to generate a Hall voltage having a first polarity (e.g., a positive Hall voltage). A positive Hall voltage 522a having a positive offset value 524a is delivered from the Hall plate 502 to the ADC 504. The resultant sum of the positive Hall voltage 522a and the positive offset 524a is tracked as a digital signal 526, which has a larger absolute magnitude than the positive Hall voltage 522a (since the offset is positive, and the same sign as the Hall voltage).

During a second clock phase 532, contacts $C_2$ and $C_4$ are coupled to a second current source 514b, while the one or more switches 512 may be configured to coupled contacts $C_3$ and $C_1$ to the ADC 504 to generate a Hall voltage having a second polarity (e.g., a negative Hall voltage). A negative Hall voltage 522b having a positive offset value 522b is delivered from the Hall plate 502 to the comparator 506. The resultant sum of the negative Hall voltage 522b and the positive offset 524b is tracked as a digital signal 526, which has a smaller absolute magnitude than the negative Hall voltage 522b (since the offset remains positive, and is the opposite sign as the Hall voltage).

Graph 520 illustrates the difference 536, which is built (e.g., by digital logic element 508 of ADC 504) between the first chopping signal 526, stored in digital storage, comprising the first Hall voltage (e.g., having a positive value) and the second chopping signal 528 comprising the second Hall voltage. Because the offsets remain the same sign in the first and second clock phases, 530 and 532, the offset signals cancel out (e.g., in clock phase 532 the offset signal 524 is removed by the difference building), resulting in a digital signal that has two times the signal amplitude but no offset. Graph 520 similarly illustrates the cancellation of offset values through difference building of the chopped signals, during a third clock phase 534.

The inventor has appreciated that difference building, as provided herein, is meant to encompass alternative processes which perform the same general process of offset cancellation, but which vary the process (e.g., to a summation process) by changing one or more signal polarities. For example, in one alternative embodiment, instead of difference building through the switches generating a positive difference (e.g., corresponding to 534) between the positive Hall voltage 522a in the first clock phase 530 and negative Hall voltage 522b in the second clock phase 532, that the switches may be configured to generate offsets having opposite polarities in clock phases 530 and 532 (e.g., to be positive and negative), so that summing (rather than difference building) is used to cancel the offsets.

It will be appreciated that in some embodiments, the circuit may operate without the switches performing chopping or spinning. For example, if the activation circuit is configured to operate with a short standby time (e.g., 1 ms) than offset error changes (e.g., caused by temperature changes) are negligible and chopping may be skipped.

Figure 6:
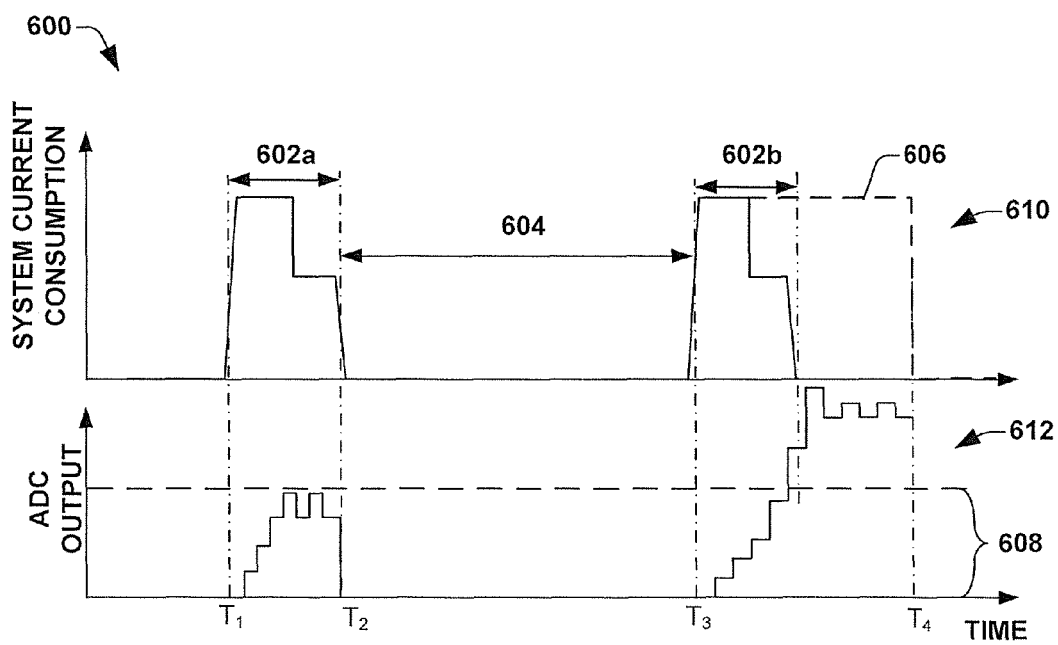
FIG. 6 illustrates a timing diagram of a motion sensor system configured to generate an activation signal by detecting the slope of a digital signal and an associated system current consumption.

FIG. 6 illustrates a timing diagram 600 of a motion sensor activation circuit configured to generate an activation signal by detecting a difference between digital signals, in particular illustrating the modes of operation. In particular, FIG. 6 illustrates a first graph 610 showing the current consumption of an external system and a second graph 612 showing the output of the ADC (e.g., corresponding to ADC 406 of FIG. 4).

In one embodiment, the activation circuit may be operated in a two phase operating scheme comprising a "high current" operating phase 602 and a "low current" standby phase 604 (e.g., in which the current consumption of the low power oscillator remains, as described below in FIG. 7). The use of the two phases results in a relatively low average operating current of the system, thereby reducing the power consumption of the system (e.g., the average current consumption of graph 610 is relatively low). In particular, during the operating phases 602 a difference detection element detects the slope of the digital signal and compares the change in value of the digital signal to a digital reference level 608. If the change in the value of the digital signal is smaller than the digital reference level 608 (e.g., corresponding to a 0.5 mT change in magnetic field), then either no change in the magnetic field has occurred or a change that is too small to detect motion has occurred in the magnetic field and the system remains in the same state. However, if change in the value of the digital signal exceeds the digital reference level 608 then a change in the magnetic field is detected and the system is awakened at the end of the operating phase (e.g., at time $T_4$). During the stand-by phase 604 the comparison is stopped and digital signal values are stored so that current consumption of the system is reduced to low current consumption (e.g., micro amperes).

In one particular example, the standby time is relatively long compared to the operating time. For example, a very low power consumption can be achieved with a timing scheme controlled by an oscillator to operate an activation circuit for approximately 50 μs followed by a standby phase of approximately 130 ms with minimum current consumption of the activation circuit. Because of the long standby time compared to the operating time the overall averaged current is slightly higher than the standby current.

As shown in FIG. 6 during a first operating phase 602a, an ADC attempts to track the magnetic signal output from a motion sensor, but fails to detect a change in the digital signal that is larger than the digital reference level and therefore does not awaken the system. In one embodiment, the tracking ADC may recognize a failure to reach the digital reference level as a stable/toggling digital signal. For example, since the digital signal toggles around a digital value (as it passes time $T_2$), it indicates a stable digital signal and no awakening of the system occurs.

In the second operating phase 602b, the ADC tries to track the magnetic signal but since the magnetic signal continually rises during the operating time (e.g., does not toggle) it detects a digital signal is larger than the digital reference level 608, and therefore instead of switching off the activation circuit is switched to longer operating time that enables the digital signal to be tracked. The longer operating time lets the activation circuit know that the digital signal (e.g., magnetic field change) exceeds the digital reference level and therefore at the end of the stage it will switch on the output switch (e.g., output transistor) to awaken the system. In other words, the activation circuit may awaken the system if difference detection is recognized, but if adaptive ADC tracking did not reach a final value the length of the operating phase 602b may be increased until ADC recognizes a final value.

In one embodiment, when the system wakes up the ADC can switch from a step-by-step tracking mode to a successive approximation mode, wherein instead of counting up in binary sequence, the ADC finds the signal by starting with the most-significant bit and finishing at the least-significant bit. In an alternative embodiment, when the system wakes up the ADC can switch from a step-by-step tracking mode to an adaptive tracking mode, wherein the ADC is configured to track in n-th step increments, wherein n=2, 4, 8, etc.

Figure 7:
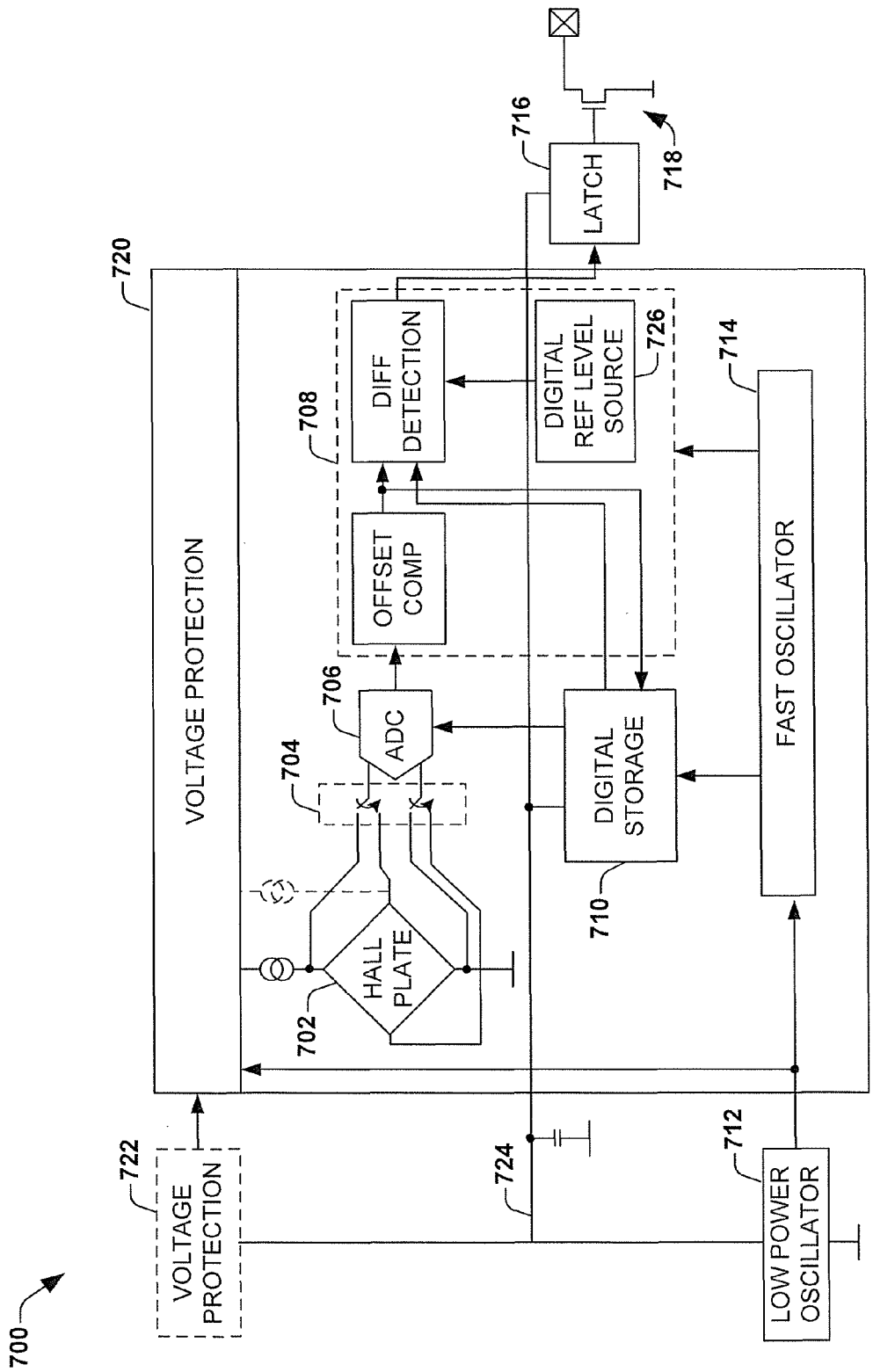
FIG. 7 illustrates a timing diagram of a more detailed embodiment of a motion sensor system configured to generate an activation signal by detecting the slope of a digital signal corresponding to a motion sensor output.

FIG. 7 illustrates a more detailed embodiment of a sensor system 700 configured to generate an activation signal by detecting a difference of a digital signal corresponding to a motion sensor output. The Hall sensor system has a signal chain comprising a Hall plate 702, switches 704, an ADC 706, and digital signal components 708 (comprising an offset compensation element, a difference detector) as described above (e.g., in FIG. 5). A digital reference level source 726 is configured to provide a digital reference level to the difference detector. In one embodiment, the digital reference level source 726 may comprise a storage element (e.g., digital storage element) within the activation circuit. In an alternative embodiment, the digital reference level source 726 may comprise an external source such as a microprocessor configured to send or program a digital reference level to/in the activation circuit.

FIG. 7 further illustrates oscillator circuits 712 and 714 configured to drive operation of the signal chain of the circuit. The ultra low power oscillator 712 may be configured to operate as a clock for the system in the standby mode, while the fast oscillator 714 is configured to drive the ADC, offset compensation, and difference detector in the operating phase. Therefore, the ultra low power oscillator 712 controls the activation time and the standby time. During the activation time the fast oscillator 714 is activated to serve as clock generator for the digital parts of the circuit (e.g., the ADC converter, the digital path that receives the output of the ADC), while in standby mode the fast oscillator 714 is switched off.

In one embodiment, an ultra low power oscillator 712 may be configured to operate in a standby phase to clock the output latch 716 so that the minimum current consumption of the standby phase is due to a minimum current consumption of the activation circuit coming from ultra low power oscillator. Therefore, the ultra low power oscillator 712 provides a voltage to the latch 716 and digital storage 710 during the standby phase.

Referring again to FIG. 7, the latch 716 is configured to generate a signal, as described above, that is provided to a switch comprising a transistor device 718 (e.g., an n-channel transistor). In one embodiment, the output of the latch 716 may comprise a voltage that is applied to the gate of the transistor 718.

In one embodiment, wherein high voltages are present in the system (e.g., in automotive applications) one or more high voltage protection circuits 720, 722 may be configured to protect the circuit components of the activation circuit from high voltages and/or reverse battery voltages. For example, as shown in FIG. 7 both the ultra low power oscillator 712 and the signal path (e.g., elements 702-708) may be configured to operate at low supply voltages (e.g., between 1.5V and 3V). Accordingly, an ultra low power high voltage and reverse voltage protection circuit 722 is configured to reject high voltages or reverse battery voltages (e.g., that may occur when a battery is installed with battery polarities applied in the reverse direction) from reaching the ultra low power oscillator 712 and a high voltage and reverse voltage protection circuit 720 is configured to reject high voltages and/or reverse battery voltages from reaching the signal path 702-708. Therefore, the high voltage and reverse voltage protection circuits 720, 722 protect the activation circuit from damage that may occur from the high and/or reverse battery voltages.

In one embodiment, the high voltage protection circuits 720 and/or 722 may comprise a depletion-MOS transistor or a JFET transistor that provides a low-voltage supply voltage at minimum supply current. In an alternative embodiment, the high voltage protection circuits 720 and/or 722 may comprise a high voltage depletion transistor and one or more diodes (e.g., Schottky diodes), wherein the high voltage depletion transistor is configured to reject high voltages while the p-n junction of the one or more diodes are configured to block battery voltages having the wrong polarity.

In one embodiment, the ultra low power voltage protection circuit 722 may provide a protected voltage to the latch 716 and/or digital storage 710 since the latch 716 and/or digital storage 710 are coupled to the high power and reverse voltage protection. For example, line 724 is configured to provide an ultra low voltage that can store information in the latch 716 and/or digital storage 710 during the both standby phases and operating phases without additional current consumption.

Figure 8:
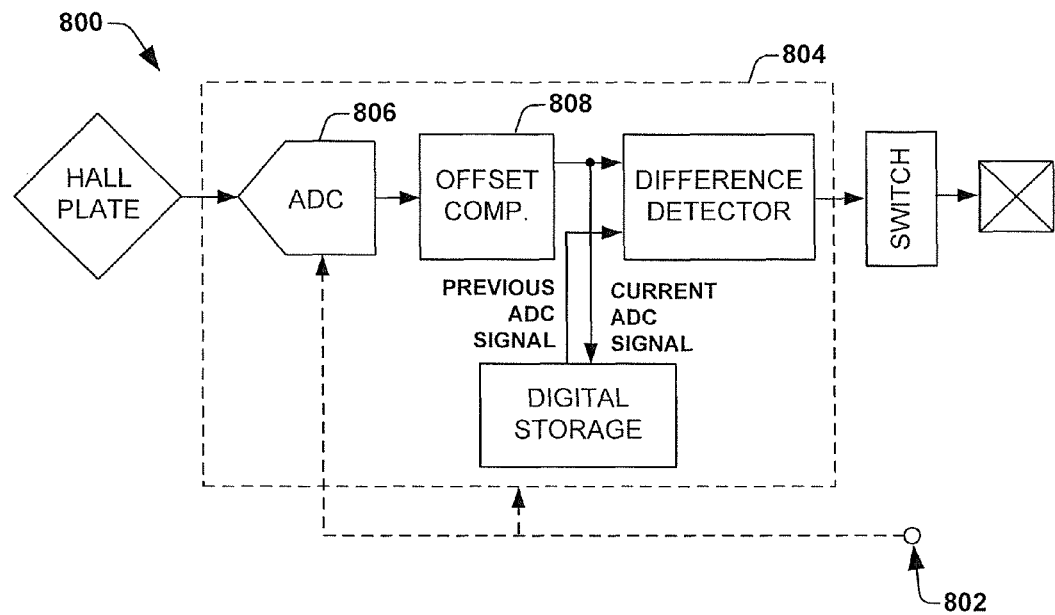
FIG. 8 is a block diagram of a Hall sensor system having an external input configured to change operating phases of the activation circuit.

FIG. 8 is a block diagram of a sensor system, configured to generate an activation signal as provided herein, having an external input 802 configured to change operating phases of the activation circuit.

The output transistor may be configured to activate an external system (e.g., microprocessor). In one embodiment, once activated, the external system may be configured to control the operating phases of the activation circuit by providing an external signal to the activation circuit (e.g., to cause the activation circuit to go from a standby mode into an operating mode as shown in FIG. 6). In one embodiment, the external signal is provided from an external input 802 to activate the digital signal path 804. In an alternative embodiment, the external signal may be provided from the external input 802 to activate one or more particular components of the activation circuit such as the ADC 806 and/or offset compensation circuit 808, for example.

In one embodiment, once activated, the external system may be configured to input an external signal at external input 802 that causes the activation circuit to go into a continuous operating mode. In yet another embodiment, once activated the external system may be configured to input an external signal at external input 802 that causes a change in the mode of operation of the ADC (e.g., from tracking mode to successive operation mode).

Figure 9:
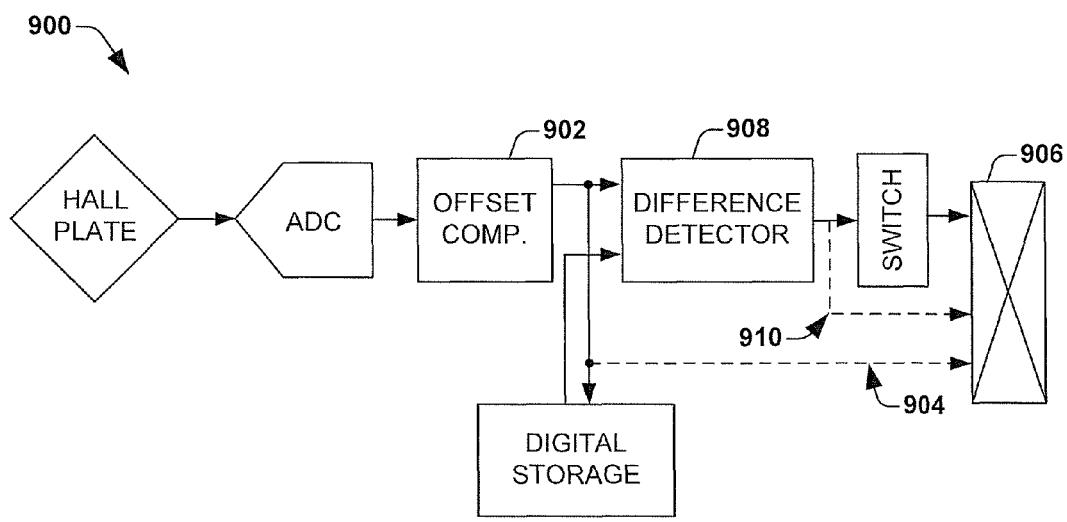
FIG. 9 is a block diagram of a Hall sensor system configured to provide an offset compensated ADC signal to an external system.

FIG. 9 is a block diagram of a Hall sensor system configured to provide information from an activation circuit 900 to an external system. In one embodiment, after the system is switched on, the activation circuit 900 may be configured to output additional information at a digital output 906 to an external system. For example, as shown in FIG. 9 the offset compensated ADC converter signal may be provided from the output of the offset compensator 902 to the digital output 906 (via connection line 904) and/or the slope or difference signal may be output from the difference detector to the digital output 906 (via connection line 910). Additional information such as the ADC output and/or difference signal can provide a real position of a magnet as sensed by the motion sensor and/or the magnitude of the movement of the magnet (e.g., the change in magnitude of the magnetic field value). In one embodiment, wherein the slope that is provided from the difference detector to the system indicates that a slow change has occurred in the motion of the magnetic sensor the system may reject the activation signal due to the slow speed of the change.

Figure 10:
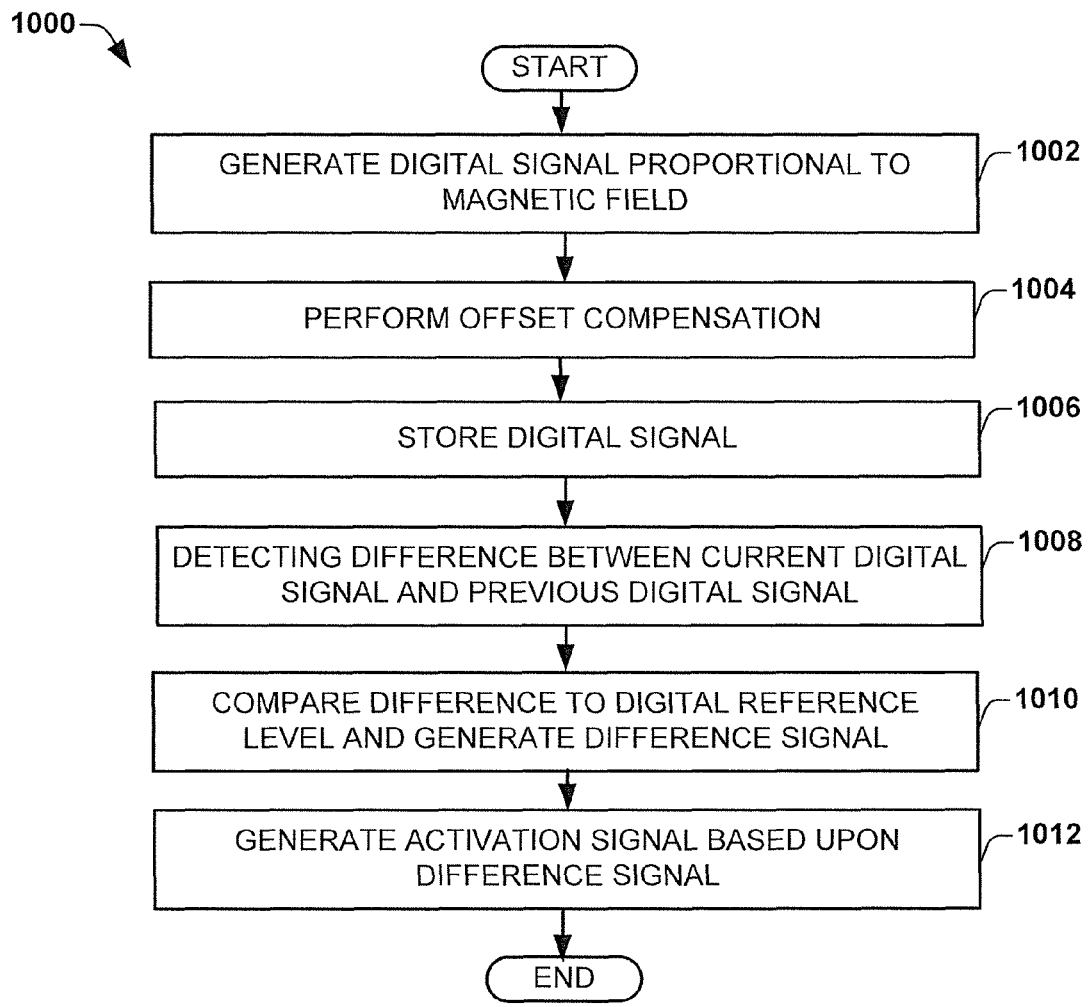
FIG. 10 is a flow diagram showing of a more detailed embodiment of the operation of a motion sensor system as provided herein.

FIG. 10 is a flow diagram showing of a more detailed embodiment of the operation of an activation circuit having a magnetic sensor as provided herein.

While method 1000 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

Furthermore, the claimed subject matter may be implemented as a method, apparatus, or article of manufacture using standard programming and/or engineering techniques to produce software, firmware, hardware, or any combination thereof to control a computer to implement the disclosed subject matter (e.g., the circuits shown in FIGS. 1, 3, etc., are non-limiting examples of circuits that may be used to implement method 1000). The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

At 1002, a digital signal is generated that is proportional to a magnetic signal provided from a magnetic motion sensor.

At 1004, offset compensation is performed on the digital signal. The offset compensation may remove offsets generated due to zero point Hall offset or AMR offset in various embodiments. For example, in an activation circuit comprising a Hall sensor the offset may be removed by current spinning techniques known in the art, while in an activation circuit comprising an AMR sensor the offset may be removed by "flipping techniques" known in the art. Additionally, the offset compensation may remove offsets generated by the ADC and/or comparator, for example.

At 1006, a digital signal is stored digitally. To detect a difference in the motion sensor output signal prior digital signal values are stored in the digital storage element, so that they may be compared to new digital signal values output from the digital signal tracking component. In one embodiment, wherein the method is operated within a two phase low power operating mode, the digital signal is stored digitally in the standby phase of operation, in contrast to other acts of the method (e.g., 1004, 1008, etc.) which may not be performed in the standby phase of operation.

A difference between a current digital signal and a previous digital signal is calculated at 1008.

At 1010, the difference is compared to a digital reference level and a difference signal is generated. An activation signal may be generated based upon the difference signal at 1012.

In one embodiment, wherein an activation signal is configured to operate in a high current operating phase and in a low current standby phase, as described above in FIG. 6. In such an embodiment, acts 1006, 1008-1012 may be performed within the high current operating phase, while storage of a digital magnetic signal may be done in both a high current operating phase and a low current standby phase.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. An activation circuit, comprising:
    a motion sensor configured to output a signal comprising a differential signal proportional to a measured quantity;
    a comparator configured to receive the differential signal from the motion sensor and to generate a comparator signal from the differential signal;
    a digital logic element coupled to an output of the comparator and configured to generate a digital signal from the comparator signal;
    a digital storage element configured to store one or more previous digital signals;
    a difference detector, wherein in an operating phase the difference detector is configured to measure a difference between the digital signal from the digital logic element and a previous digital signal from the digital storage element and to output a difference signal comprising information concerning a magnitude of the difference, wherein if the difference is larger than a digital reference level, the difference detector causes an activation signal generator to generate an activation signal that awakens a system from a sleep; and
    wherein in a low power standby phase, digital signals are stored in the digital storage element.

2. The activation circuit of claim 1, wherein the comparator and the digital logic element are comprised within an analog-to-digital converter configured to track the measured quantity by converting the signal to the digital signal which corresponds to the quantity.

3. The activation circuit of claim 2, wherein after the system is activated, the digital signal output from the analog-to-digital converter or the difference signal output of the difference detector is output to the system.

4. The activation circuit of claim 2, wherein after the system is activated, the analog-to-digital converter is configured to change from a step-by-step tracking mode to a successive operation mode or an adaptive tracking mode.

5. The activation circuit of claim 2, wherein the motion sensor is a magnetic motion sensor, the signal is a magnetic signal and the quantity is a magnetic field; the activation circuit further comprising an offset compensation circuit located between the analog-to-digital converter and the difference detector, and configured to remove an offset of the magnetic signal such that the difference detector compares a first offset compensated signal with second offset compensated signal.

6. The activation circuit of claim 5, further comprising:
    one or more switches disposed between the magnetic motion sensor and the analog-to-digital converter, the one or more switches configured to be selectively operated at a chopping frequency that enables a current spinning method to provide a first chopping signal comprising the offset and a second chopping signal comprising the offset; and
    wherein the analog-to-digital converter is configured to cancel the offset by building a modulated digital signal from the first chopping signal and the second chopping signal.

7. The activation circuit of claim 2, further comprising:
    an low power oscillator configured to operate as a clock for the activation circuit in the standby phase; and
    a fast oscillator configured to drive the analog-to-digital converter, and the difference detector in the operating phase.

8. The activation circuit of claim 1, further comprising:
    a current steering digital to analog converter coupled to the comparator and configured to compensate the differential input signal of the comparator.

9. The activation circuit of claim 1, wherein the operating phase is initialized from an external system that is external to the activation circuit or by achieving a stable digital signal.

10. The activation circuit of claim 1, further comprising:
    one or more high voltage protection circuits configured to reject high voltages or reverse battery voltages.

11. The activation circuit of claim 10, wherein the one or more high voltage protection circuits comprises a depletion-MOS transistor or a JFET transistor that provides a low-voltage supply voltage at minimum supply current for an ultra low-power oscillator and a latch and the digital storage element.

12. The activation circuit of claim 1, wherein the digital reference level is provided to the activation circuit from an apparatus external to the activation circuit.

13. The activation circuit of claim 1, further comprising:
    an offset compensation circuit configured to remove an offset of the digital signal such that the difference detector compares a first offset compensated signal with second offset compensated signal.

14. A method for activating a system from a sleep, comprising:
    generating a digital signal proportional to a measured motion sensor signal;
    performing offset compensation to remove a non-zero offset that is present in the digital signal;
    detecting a difference between an offset compensated current digital signal and offset compensated previous digital signals, that are stored in a digital storage element; and
    comparing the detected difference to a digital reference level, wherein if the difference is larger than a digital reference level an activation signal awakens a system from a sleep mode.

15. The method of claim 14,
    wherein performing the offset compensation comprises:
        calculating a difference between offset values of a motion sensor; and generating a chopping signal having a modulated amplitude which is based upon the difference between offset values.

16. An activation circuit, comprising:
a motion sensor configured to output a signal proportional to a measured quantity;
a digital difference detection circuit configured to operate in a low power standby phase and an operating phase,
a low power oscillator configured to provide a first plurality of clock signals to an activation signal generator in the low power standby phase;
a fast oscillator configured to provide a second plurality of clock signals to the digital difference detection circuit in the operating phase;
wherein in the low power standby phase, digital signals are stored in a digital storage element; and
wherein in the operating phase the digital difference detection circuit compares a current digital signal to previous digital signals stored in the digital storage element, and causes the activation signal generator to generate an activation signal that awakens a system from a sleep if a difference between the current digital signal and the previous digital signals is larger than a non-zero digital reference level.

17. The activation circuit of claim 16, further comprising:
an analog-to-digital converter configured to convert the signal to a digital signal, which is provided to the digital difference detection circuit.

18. The activation circuit of claim 17,
wherein the low power oscillator is configured to provide the first plurality of clock signals to the analog-to-digital converter in the low power standby phase; and
wherein the fast oscillator is configured to provide the second plurality of clock signals to the digital difference detection circuit in the operating phase.

19. The activation circuit of claim 16, further comprising:
an offset compensation circuit located configured to remove an offset of the signal prior to the signal being provided to the digital difference detection circuit.

20. The activation circuit of claim 16, wherein the digital reference level is provided to the activation circuit from an apparatus external to the activation circuit.

* * * * *